(12) United States Patent
Fritzsche et al.

(10) Patent No.: US 6,724,070 B2
(45) Date of Patent: Apr. 20, 2004

(54) FINE PITCH LEAD FRAME

(75) Inventors: Robert M. Fritzsche, Attleboro Falls, MA (US); Donald C. Abbott, Norton, MA (US)

(73) Assignee: Texas Instruments Incorporated, Dallas, TX (US)

( * ) Notice: Subject to any disclaimer, the term of this patent is extended or adjusted under 35 U.S.C. 154(b) by 70 days.

(21) Appl. No.: 10/170,033

(22) Filed: Jun. 12, 2002

(65) Prior Publication Data

US 2002/0153597 A1 Oct. 24, 2002

Related U.S. Application Data

(62) Division of application No. 09/212,013, filed on Dec. 15, 1998, now Pat. No. 6,429,050.
(60) Provisional application No. 60/068,046, filed on Dec. 18, 1997.

(51) Int. Cl.[7] ................ H01L 23/50; H01L 23/495; H01L 23/48; H01L 23/34; H01L 23/52
(52) U.S. Cl. ................ 257/666; 257/775; 257/696; 257/698; 257/690; 257/669; 257/672
(58) Field of Search .................. 257/666, 696, 257/698, 692, 693, 690, 674, 669–672, 775

(56) References Cited

U.S. PATENT DOCUMENTS

| 4,308,339 A | | 12/1981 | Lindberg | |
|---|---|---|---|---|
| 4,329,642 A | | 5/1982 | Luthi et al. | |
| 4,411,719 A | | 10/1983 | Lindberg | |
| 5,221,428 A | | 6/1993 | Ohsawa et al. | |
| 5,230,144 A | | 7/1993 | Ootsuki | |
| 5,403,466 A | | 4/1995 | West et al. | |
| 5,420,758 A | * | 5/1995 | Liang | 257/666 |
| 5,424,577 A | * | 6/1995 | Szuki et al. | 257/670 |
| 5,466,966 A | | 11/1995 | Ito | |
| 5,530,281 A | * | 6/1996 | Groover et al. | 257/666 |
| 5,683,943 A | | 11/1997 | Yamada | |
| 5,864,173 A | * | 1/1999 | Fogelson | 257/666 |
| 5,945,259 A | | 8/1999 | Kim | |
| 6,008,542 A | * | 12/1999 | Takamori | 257/773 |

FOREIGN PATENT DOCUMENTS

| JP | 59-88855 | * | 5/1984 | 257/666 |
|---|---|---|---|---|
| JP | 63-299369 | * | 12/1988 | 29/827 |
| JP | 404094564 A | * | 3/1992 | 257/666 |
| JP | 6-45497 | * | 2/1994 | 257/690 |
| JP | 11-330132 | * | 11/1999 | |

* cited by examiner

*Primary Examiner*—Alexander O. Williams
(74) *Attorney, Agent, or Firm*—Yingsheng Tung; Wade James Brady, III; Frederick J. Telecky, Jr.

(57) ABSTRACT

A lead frame including a first set of leads in a first plane and a second set of leads in a second plane offset vertically from the second plane. The leads in the first and second planes are offset from each other by a lead width.

4 Claims, 2 Drawing Sheets

FINE PITCH LEAD FRAME

This is a divisional application of Ser. No. 09/212,013 filed Dec. 15,1998, now U.S. Pat. No. 6,429,050, which claims priority of provisional patent application No. 60/068, 046 filed Dec. 18, 1997.

FIELD OF THE INVENTION

The invention relates to lead frames, and more particularly to a lead frame having finely pitched leads, and the method of making.

BACKGROUND OF THE INVENTION

Conventional fine-pitched lead frame designs rely upon lead separation in the X-Y plane to prevent electrical shorting between adjacent leads. In some designs, an insulating tape is placed across the leads to stabilize them and to hold them in place. However, as lead pitch (distance between the center lines of the leads) gets finer, and the number of leads increase, other means must be used to prevent shorting of lead.

Fine pitched leads have been formed with the lead end adjacent to the semiconductor die reduce in thickness and tapered to provide narrower leads as the leads converge toward the semiconductor die. A similar lead is disclosed in U.S. Pat. No. 5,454,905.

SUMMARY OF THE INVENTION

The invention is a lead frame that has leads formed in two levels during the etching process in which the lead frame is formed. A lead frame form, or continuous strip of lead frame material, is coated on two sides with a photo resist material. Each photo resist coated side is patterned to define leads on the lead frame. The lead patterns on the two sides are offset from each other so that patterns on one side of the lead frame material alternate with the patterns on the other side of the lead frame material. Both sides of the photo resist patterned lead frame material are etched to a depth exceeding one-half the thickness of a lead. The photo resist material is then removed. The resulting lead frame has leads that are in two levels, each level having leads offset by a lead width from the other level, but with an effective zero distance between leads horizontally.

DESCRIPTION OF A PREFERRED EMBODIMENT

Figure 1:
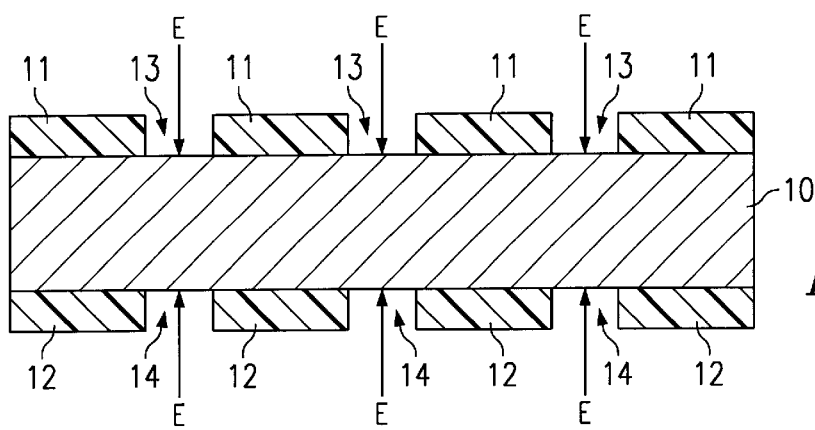
FIGS. 1–3 show a prior art process of forming fine-pitch leads.
Figure 2:
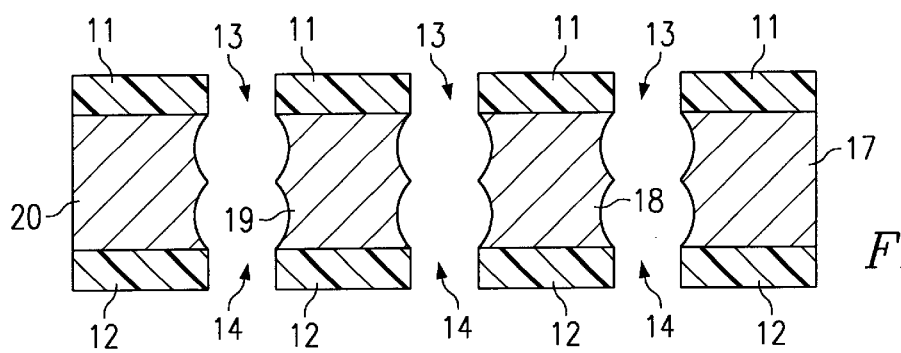
Figure 3:
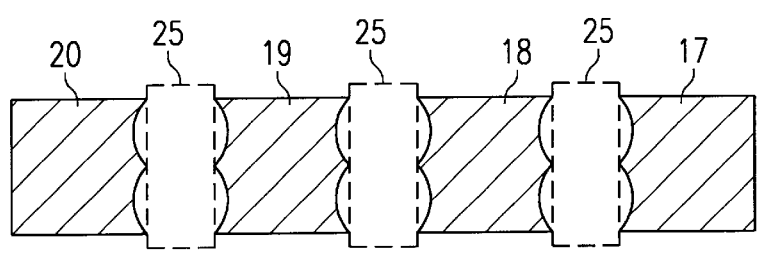

FIGS. 1–3 illustrate a prior art method for forming leads by an etch process. In FIG. 1, a sheet of metal 10 is masked and patterned with a photo resist 11, on top of the metal 10 and photo resist 12 on the bottom of metal 10. Openings 13 in the top photo resist material 11 are formed to expose areas that are to be etched. Similarly, openings 14 are formed in the bottom photo resist 12. Arrows E show the etch paths through openings 13 and 14.

FIG. 2 shows the resulting etch paths in sheet metal 10. The paths extend from openings 13 to 14, completely through sheet metal 10. The paths 21, 22 and 23 divide sheet metal 10 in to segments 17, 18, 19 and 20 which are the leads of the lead frame. The spacing between leads are shown in FIG. 3 by the dashed rectangles 25. Typically, the leads 17–20 will be 3 mils wide, 5 mils thick, and spaced a minimum of 4 mils apart.

Figure 4:
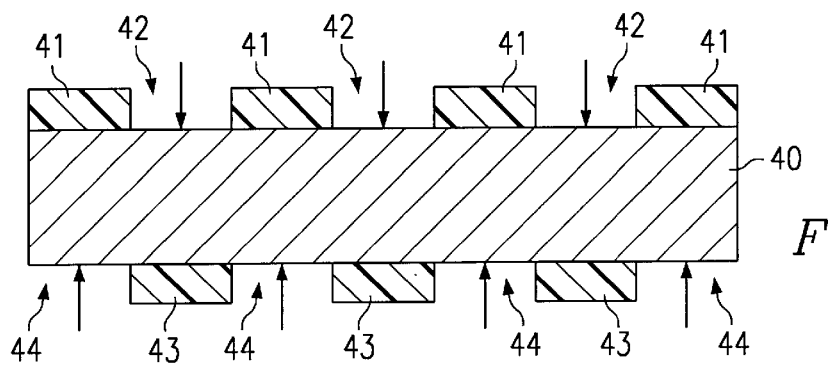
FIGS. 4–6 show the lead formation process for forming multi-layer fine pitched leads.

FIG. 4 shows sheet metal 40 which is the starting material for the multi-level leads of the invention. Sheet metal 40 is coated on a first side by photo resist 41 which is patterned to expose areas 42, and a second side of sheet metal 40 is coated with photo resist material 43 which is patterned to expose areas 44. It should be noted that the exposed areas 42 and 44 to not line up on opposite sides of sheet metal 40, but are off set so that photo resist 41 corresponds to open areas 44, and photo resist pattern 43 lines up with open areas 42. Sheet metal 40 is etched through openings 42 and 44 as indicated by arrows E.

Figure 5:
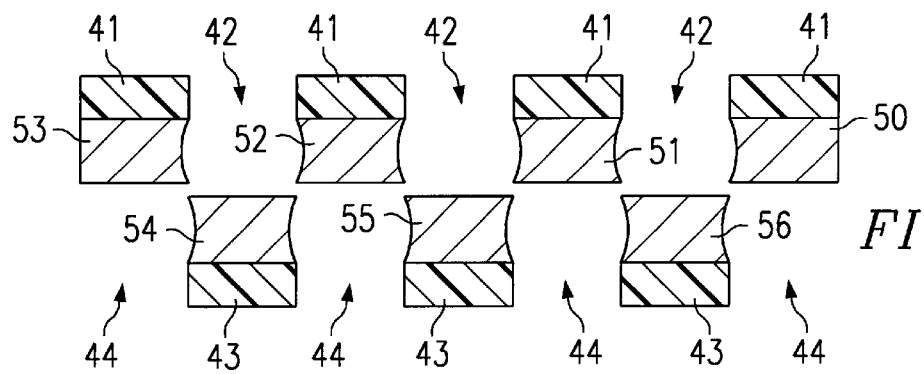
Figure 6:
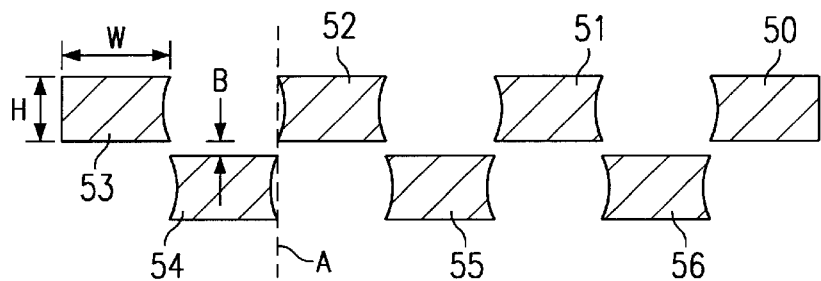

The etched sheet metal 40 is shown in FIG. 5. Sheet metal 40 is etched to form two levels of leads that are separated both horizontally and vertically by the etch process. The leads 50–53 are on a first level, and leads 54–56 are on a second level. The leads are of a standard width, but effectively have zero clearance between them horizontally, but the offset of the two levels provide the electrical isolation of the leads, one from the other. After the patterned photo resist coating is removed, the leads are as illustrated in FIG. 6. The vertical dashed line A shows that there is not separation of the lead, but they are separated vertically by an amount indicated at B. The vertical separation indicated by B can range from 10 to 20% of sheet metal thickness. Each lead can be a standard size with a width W equal to 2 mils or greater, and a thickness H equal to just less than one-half the sheet metal thickness. The dimensions W and H may be varied depended upon the number of leads required by a specific device.

Figure 7:
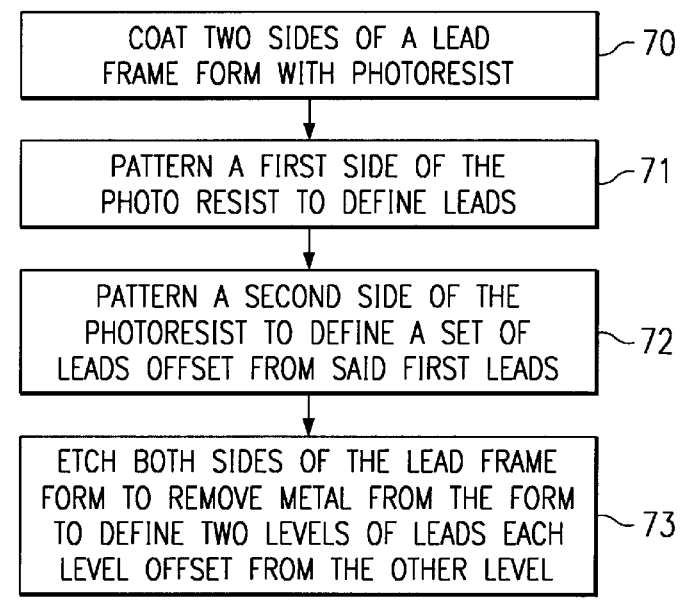
FIG. 7 is a process flow diagram of the method of making the lead frame of the present invention.

The basic process for producing the leads on two levels is shown in FIG. 7. The process is as follows. A lead frame form, or continuous strip of lead frame material, is coated on two sides with a photo resist material (70). Each photo resist coated side is patterned to define leads on the lead frame (71,72). The lead patterns o the two sides are offset from each other so that patterns on one side of the lead frame material alternate with the patterns on the other side of the lead frame material. Both sides of the photo resist patterned lead frame material are etched (73) to a depth exceeding the thickness of a lead (one-half the sheet metal thickness). The photo resist material is then removed. The resulting lead frame has leads that are in two levels, each level having leads offset by a lead width from the other level.

What is claimed is:

1. A lead frame, comprising:

sheet metal having top and bottom opposing surfaces;

a first set of leads formed in said sheet metal by etching a pattern into said top surface, each of said leads having a width dimension and each of said leads spaced from one another by a distance approximately the same as said width dimension, said leads having a thickness less than half of the distance between said top and bottom opposing surfaces;

a second set of leads formed in said sheet metal by etching a pattern into said bottom surface, each of said leads having said width dimension and each of said leads spaced from one another by a distance approximately the same as said width dimension, said leads having a thickness less than half of the distance between said top and bottom opposing surfaces;

wherein said second set of leads is offset from said first set of leads in a plane parallel to said top and bottom surfaces by a distance approximately equal to said width dimension; and further wherein said first and second sets of leads are separated from one another in a plane perpendicular to said top and bottom surfaces.

2. The lead frame of claim 1, wherein said first and second sets of leads are separated from one another in a plane perpendicular to said top and bottom surfaces by a distance in the range of ten to twenty percent of the thickness of said sheet metal.

3. A lead frame, comprising:

sheet metal having parallel top and bottom opposing surfaces;

a first set of leads in said sheet metal in a plane parallel to said top and bottom opposing surfaces;

a second set of leads in said sheet metal in a plane parallel to said top and bottom opposing surfaces;

wherein said first and second sets of leads are separated from one another in a plane perpendicular to said top and bottom surfaces, and further wherein both said first and second sets of leads lie completely within said top and bottom opposing surfaces of said sheet metal.

4. The lead frame of claim 3, wherein said separation of said leads in said plane perpendicular to said top and bottom surfaces of said sheet metal is in the range often to twenty percent of the thickness of said sheet metal.

* * * * *